(12) United States Patent
de Oliveira et al.

(10) Patent No.: US 10,323,324 B2
(45) Date of Patent: Jun. 18, 2019

(54) METHOD FOR PRODUCING PATTERNED METALLIC COATINGS

(71) Applicant: Leibniz-Institut für Neue Materialien gemeinnützige GmbH, Saarbruecken (DE)

(72) Inventors: Peter William de Oliveira, Saarbruecken (DE); Tobias Dörr, Merchweiler (DE); Karsten Moh, Blieskastel-Brenschelbach (DE)

(73) Assignee: Leibniz-Institut fuer Neue Materialien gemeinnuetzige GmbH, Saarbruecken (DE)

( * ) Notice: Subject to any disclaimer, the term of this patent is extended or adjusted under 35 U.S.C. 154(b) by 54 days.

(21) Appl. No.: 15/101,947

(22) PCT Filed: Dec. 4, 2014

(86) PCT No.: PCT/EP2014/076522
§ 371 (c)(1),
(2) Date: Jun. 6, 2016

(87) PCT Pub. No.: WO2015/090991
PCT Pub. Date: Jun. 25, 2015

(65) Prior Publication Data
US 2016/0305016 A1    Oct. 20, 2016

(30) Foreign Application Priority Data

Dec. 19, 2013   (DE) .................. 10 2013 114 572

(51) Int. Cl.
| | | |
|---|---|---|
| *B05D 1/00* | (2006.01) | |
| *B05D 1/02* | (2006.01) | |
| *B05D 1/18* | (2006.01) | |
| *B05D 1/28* | (2006.01) | |
| *B05D 3/00* | (2006.01) | |
| *B05D 3/02* | (2006.01) | |
| *B05D 3/06* | (2006.01) | |
| *B05D 3/10* | (2006.01) | |
| *C09D 5/24* | (2006.01) | |
| *C23C 16/06* | (2006.01) | |
| *C23C 18/02* | (2006.01) | |
| *C23C 18/04* | (2006.01) | |
| *C23C 18/08* | (2006.01) | |
| *C23C 18/14* | (2006.01) | |
| *C23C 18/16* | (2006.01) | |
| *C23C 18/31* | (2006.01) | |
| *C23C 18/40* | (2006.01) | |
| *C23C 18/44* | (2006.01) | |

(52) U.S. Cl.
CPC .......... *C23C 18/1603* (2013.01); *B05D 1/005* (2013.01); *B05D 1/02* (2013.01); *B05D 1/18* (2013.01); *B05D 1/28* (2013.01); *B05D 3/002* (2013.01); *B05D 3/0254* (2013.01); *B05D 3/065* (2013.01); *B05D 3/10* (2013.01); *C09D 5/24* (2013.01); *C23C 16/06* (2013.01); *C23C 18/02* (2013.01); *C23C 18/04* (2013.01); *C23C 18/08* (2013.01); *C23C 18/14* (2013.01); *C23C 18/16* (2013.01); *C23C 18/1601* (2013.01); *C23C 18/166* (2013.01); *C23C 18/1607* (2013.01); *C23C 18/1608* (2013.01); *C23C 18/1633* (2013.01); *C23C 18/1655* (2013.01); *C23C 18/1658* (2013.01); *C23C 18/1662* (2013.01); *C23C 18/1667* (2013.01); *C23C 18/31* (2013.01); *C23C 18/40* (2013.01); *C23C 18/44* (2013.01)

(58) Field of Classification Search
CPC ......... C23C 18/02; C23C 18/04; C23C 18/06; C23C 18/08; C23C 18/14; C23C 18/16; C23C 18/1601; C23C 18/1603; C23C 18/1607; C23C 18/1608; C23C 18/1633; C23C 18/1655; C23C 18/1658; C23C 18/166; C23C 18/1662; C23C 18/1667; C23C 18/31; C23C 18/40; C23C 18/44; B05D 1/02; B05D 1/005; B05D 1/18; B05D 1/28; B05D 3/002; B05D 3/065; B05D 3/10; B05D 3/0254
USPC ................................................. 427/333, 337
See application file for complete search history.

(56) References Cited

U.S. PATENT DOCUMENTS

| | | | |
|---|---|---|---|
| 5,593,781 A | 1/1997 | Nass et al. | |
| 5,910,522 A | 6/1999 | Schmidt et al. | |
| 9,387,446 B2 * | 7/2016 | Bormashenko | ........ A61K 9/107 |

(Continued)

FOREIGN PATENT DOCUMENTS

| | | |
|---|---|---|
| CN | 101677913 A | 3/2010 |
| CN | 101945975 A | 1/2011 |

(Continued)

OTHER PUBLICATIONS

Translation of International preliminary Report on Patentability, dated Jun. 30, 2016.

(Continued)

*Primary Examiner* — William P Fletcher, III
(74) *Attorney, Agent, or Firm* — Cahn & Samuels, LLP

(57) ABSTRACT

A method for producing patterned metallic coatings includes an initiator composition having at least one active substance being added to a substrate. A precursor composition including at least one precursor compound for a metallic layer is applied to the initiator composition coating. A metallic layer is then deposited by the active substance. At least one composition is applied as an emulsion in order to obtain a patterning of the resultant metallic layer.

7 Claims, 12 Drawing Sheets

(56) References Cited

U.S. PATENT DOCUMENTS

| | | |
|---|---|---|
| 2006/0115636 A1 | 6/2006 | Yoshida et al. |
| 2006/0122297 A1 | 6/2006 | Dupuis et al. |
| 2008/0220176 A1* | 9/2008 | Carlblom ............... C08F 2/22 427/445 |
| 2008/0254295 A1* | 10/2008 | Hibst .................... A61K 8/27 428/407 |
| 2009/0269510 A1 | 10/2009 | Lieberman et al. |
| 2010/0316684 A1* | 12/2010 | Daniels ............... A61K 8/046 424/401 |
| 2011/0003141 A1 | 1/2011 | Garbar |
| 2011/0124252 A1 | 5/2011 | Shimomura et al. |
| 2011/0143051 A1* | 6/2011 | Ohashi ............. C09D 11/0235 427/553 |
| 2011/0175065 A1 | 7/2011 | de la Vega et al. |
| 2013/0037158 A1 | 2/2013 | Gardner |
| 2013/0236708 A1 | 9/2013 | Moh et al. |
| 2013/0236732 A1 | 9/2013 | de Oliveria et al. |
| 2013/0337158 A1 | 12/2013 | Eiden et al. |
| 2014/0290724 A1 | 10/2014 | Granstrom et al. |

FOREIGN PATENT DOCUMENTS

| | | |
|---|---|---|
| CN | 103328685 A | 9/2013 |
| DE | 1212633 A1 | 10/1993 |
| EP | 1553212 A1 | 7/2005 |
| JP | H10340629 A | 12/1998 |
| WO | 9321127 A1 | 10/1993 |
| WO | 9631572 A1 | 10/1996 |
| WO | 2012/084849 A2 | 6/2012 |
| WO | 2012084849 A2 | 6/2012 |
| WO | 2012094849 A2 | 6/2012 |
| WO | 2013068853 A2 | 5/2013 |

OTHER PUBLICATIONS

English Abstract of CN 101677913, dated Mar. 24, 2010.
English Abstract of CN 101945975, dated Jan. 12, 2011.
English Abstract of CN 103328685, dated Sep. 25, 2013.
English Abstract of WO 20121084849, dated Jun. 28, 2012.
English Abstract of JPH10340629A, dated Dec. 22, 1998.
English translation of JPH10340629A, dated Dec. 22, 1998.

* cited by examiner

METHOD FOR PRODUCING PATTERNED METALLIC COATINGS

FIELD OF THE INVENTION

The invention relates to a method for producing structured metallic coatings, which are preferably transparent.

Background of the Invention

Structured conductive coatings play an important role in many applications. Such structured conductive coatings are required in particular for touch screens or OLEDs. The coatings are also preferably transparent.

One problem in this connection is that the substrates of the aforementioned applications are mostly made of plastic. Such plastics are not only insulators, but also require low temperatures during the treatment of their surfaces.

In particular, transparent coatings require particularly fine structures. These cannot be obtained readily by means of pressure methods. The coating of relatively large areas is also problematic.

The document WO 2012/084849 A2 discloses emulsions with silver nanoparticles which form conductive structures on surfaces. Here, the silver nanoparticles form the conductive structures after a sintering process. A disadvantage here is that particularly the conductivity cannot be controlled very easily and the production of the structures requires a sintering process at elevated temperatures.

Summary of the Invention

The problem addressed by the invention is to provide a method for coating surfaces with conductive coatings, which can be carried out at low temperatures and which moreover permits good control over the structures.

This problem is solved by the inventions having the features of the independent claims. Advantageous embodiments of the inventions are characterized in the dependent claims. The wording of all of the claims is hereby incorporated into this description. The inventions also include all useful and in particular all mentioned combinations of independent and/or dependent claims.

The problem is solved by a method for producing structured metallic coatings, comprising the following steps:
a) application of an initiator composition to a substrate comprising at least one active substance;
b) application of a precursor composition to the substrate comprising at least one precursor compound for a metal layer;
c) deposition of a metal layer from the precursor composition by the active substance of the initiator composition;
where at least one of the compositions in step a) and/or step b) is an emulsion.

Individual method steps are described in more detail below. The method to be described can also have further, unspecified steps.

The substrate which is to be coated with the initiator composition can be any material suitable for this purpose. Examples of suitable materials are metals or metal alloys, glass, ceramic, including oxide ceramic, glass ceramic or plastics, as well as paper and other cellulose-containing materials. It is of course also possible to use substrates which have a surface layer made of the aforementioned materials. The surface layer may be e.g. a metallization, an enameling, a glass or ceramic layer or a paint.

Examples of metals or metal alloys are steel, including stainless steel, chromium, copper, titanium, tin, zinc, brass and aluminum. Examples of glass are soda lime glass, borosilicate glass, lead crystal and silica glass. It may be e.g. flat glass, hollow glass such as container glass, or laboratory apparatus glass. The ceramic is e.g. a ceramic based on the oxides $SiO_2$, $Al_2O_3$, $ZrO_2$ or MgO or the corresponding mixed oxides. Examples of the plastic which, like the metal, can be in the form of a film, are polyethylene (PE), e.g. HDPE or LDPE, polypropylene, polyisobutylene, polystyrene (PS), polyvinyl chloride (PVC), polyvinylidene chloride, polyvinyl butyral, polytetrafluoroethylene, polychlorotrifluoroethylene, polyacrylates, polymethacrylates such as polymethyl methacrylate (PMMA), polyamide, polyethylene terephthalate, polycarbonate, regenerated cellulose, cellulose nitrate, cellulose acetate, cellulose triacetate (TAC), cellulose acetate butyrate or rubber hydrochloride. A painted surface can be formed from customary primers or paints. In a preferred embodiment, the substrates are films, in particular polyethylene terephthalate films or polyimide films.

According to the invention, at least one of the compositions is an emulsion. The active substance and/or the precursor compound are then preferably arranged in one of the phases, particularly preferably at the phase interface. This often already results from the fact that the active substance and/or the precursor compound have a different distribution within the phases of the emulsion, e.g. because they are hydrophobic or hydrophilic. This leads, upon application to a surface, the patterning of the emulsion being transferred to the surface. A self-organization of the emulsion occurs on the surface. In this way, it is possible to obtain a grid-like or honeycomb-like structure.

Preferably, the emulsion is a Pickering emulsion, i.e. an emulsion which is stabilized by the addition of particles. In such emulsions, the particles, in particular nanoparticles, position themselves around the disperse phase of the emulsion, and thereby stabilize the emulsion. How great the stabilization is depends firstly on the radius of the particles, the interfacial tension, but also on their wettability. Optimum stabilization of an oil/water emulsion is usually achieved at a contact angle of 90° C. Consequently, the particles must also not be too hydrophobic or hydrophilic.

Particularly in the case of Pickering emulsions, the application to a surface leads to a self-organization of the particles along the phase interfaces. This leads to a grid-like or honeycomb-like structure being obtained which consists of the nanoparticles present in the emulsion.

The emulsion here can also comprise dispersants for the stabilization. It may be an O/W or W/O emulsion. Preference is given to an O/W emulsion. Here, the hydrophobic phase is the disperse phase. In the case of a Pickering emulsion, the nanoparticles present in the emulsion stabilize the disperse phase of the emulsion.

An emulsion used preferably consists of an aqueous phase and an oily phase. For the aqueous phase, preference is given to water or mixtures comprising water and organic, preferably water-soluble solvent. Particularly preferably, the aqueous phase is water or mixtures of water and alcohols, aldehydes and/or ketones, particularly preferably water or mixtures of water with mono- or polyhydric alcohols having up to four carbon atoms, such as e.g. methanol, ethanol, n-propanol, isopropanol or ethylene glycol, aldehydes having up to four carbon atoms, such as e.g. formaldehyde, and/or ketones having up to four carbon atoms, such as e.g. acetone or methyl ethyl ketone. The aqueous phase is very particularly preferably water.

The oil phase is preferably at least one organic solvent which is not soluble in the aqueous phase. Preferably, these are aromatic or aliphatic hydrocarbons having at least five carbon atoms, such as petroleum ether, hexane, heptane, toluene, benzene, cyclopentane or cyclohexane, halogenated aromatic or aliphatic hydrocarbons such as dichloromethane, chloroform, alkyl acetates such as butyl acetate, ketones such as acetophenone or cyclohexanone. It is also possible to use mixtures of the solvents.

For both phases of the emulsion, solvents with a boiling point of less than 150° C. are preferred.

For an emulsion, the fraction of the oil phase is preferably between 15% by weight and 80% by weight, based on the total composition. Here, a content of >50% by weight usually leads to a W/O emulsion, whereas a content of <50% by weight leads to an O/W emulsion.

Particular preference is given to emulsions with a content between 15% by weight and 40% by weight of oil phase, based on the total composition, preferably between 20% by weight and 30% by weight in the case of an O/W emulsion and between 60% by weight and 80% by weight in the case of a W/O emulsion.

The emulsions, like the compositions, can also comprise further compounds, such as, for example, polymers, buffers or dispersion auxiliaries, film formers etc. Preferably, the compositions comprise these auxiliaries in an amount of not more than 10% by weight, preferably not more than 5% by weight, based on the total composition.

In a preferred embodiment of the invention, the emulsion comprises no additives, in particular no surface-active compounds, binders, polymers, buffers or dispersants.

The initiator composition comprises, as initiator, at least one active substance which can bring about a deposition of a metal layer from the precursor compound. This may be different compounds—dependent on activation of the deposition. Thus, the deposition can be brought about thermally, chemically and/or by irradiation.

The active substance can comprise, for example, reducing groups or precursors thereof, such as aldehyde groups.

Preferably, the initiator composition comprises, as initiator, a photocatalytically active inorganic substance. Here, photocatalytically active substance is understood as meaning a compound which directly brings about the reduction of a metal ion in a metal complex to give the metal, and/or brings it about indirectly by oxidative activation of the metal complex or of a further substance, without itself being decomposed in the process. The products that are formed during the oxidation result in a decomposition of the metal complex and reduction of the metal ion of the complex. The photocatalytic material may be ZnO or $TiO_2$, with $TiO_2$ being preferred. Particularly preferably, the $TiO_2$ is in the form of anatase.

The $TiO_2$ can also be in the form of amorphous $TiO_2$. Preferably, they are nanoscale particles of $TiO_2$. They may be, for example, nanoscale particles of $TiO_2$ which have an average diameter of less than 200 nm, preferably an average diameter of less than 50 nm, particularly preferably of less than 20 nm (determined by means of TEM). Particular preference is given to particles with an average diameter (determined by means of TEM) between 1 and 100 nm, preferably between 1 and 20 nm.

In one embodiment of the invention, the hydrodynamic radius of the particle used (measured with DLS) is less than 300 nm, preferably less than 200 nm, particularly preferably less than 150 nm. In a very particularly preferred embodiment of the invention, the hydrodynamic radius of the particles is less than 120 nm. In this connection, the particles can also be present as aggregates with the specified hydrodynamic radii. The particles can be present here as distribution of particles, of which at least 90% have hydrodynamic radii within the aforementioned limits.

In one embodiment of the invention, the particles have, independently or in combination with the above parameters, a $d_{50}$ value of less than 100 nm, measured by means of dynamic light scattering. The particles preferably have a $d_{80}$ value of less than 150 nm.

The hydrodynamic radius can increase through a surface modification of the particles. In one embodiment of the invention, in the case of unmodified particles, particles with a $d_{50}$ value of less than 50 nm, preferably with a $d_{80}$ value of less than 50 nm, are preferred. In the case of a surface modification, particles with a $d_{50}$ value of less than 100 nm, preferably with a $d_{80}$ value of less than 150 nm, are preferred (everything measured by means of dynamic light scattering).

The particles used are preferably present in colloidally stable form. Optionally—but not preferably—stabilizing auxiliaries may also be added.

Particularly when using a photocatalytically active initiator composition, preferably with $TiO_2$ particles, it is possible for any organic constituents located on the surface of the particles to be removed. If directly metallic particles are applied, such organic constituents can severely disrupt the conductivity. The method according to the invention is considerably less influencable by such additives. Consequently, the patterning on the surface can be controlled much more precisely.

Particular preference is given to particles which are obtained with a substoichiometric amount of water under hydrothermal conditions, as described, for example, in US 2009/0269510 A1. Such particles can also be produced in doped form.

For this, in the case of the nanoparticles, a suitable metal compound can be used for the doping during their production, e.g. an oxide, a salt or a complex compound, e.g. halides, nitrates, sulfates, carboxylates (e.g. acetates) or acetylacetonates. The compound should be expediently soluble in the solvent used for producing the nanoparticles. A suitable metal is any metal, in particular a metal selected from the 5th to 14th group of the periodic table of the elements and the lanthanoids and actinides. The groups are listed here in accordance with the new IUPAC system, as given in Römpp Chemie Lexikon, 9th edition. The metal can occur in the compound in any suitable oxidation state.

Examples of suitable metals for the metal compound are W, Mo, Zn, Cu, Ag, Au, Sn, In, Fe, Co, Ni, Mn, Ru, V, Nb, Ir, Rh, Os, Pd and Pt. Metal compounds of W(VI), Mo(VI), Zn(II), Cu(II), Au(III), Sn(IV), In(III), Fe(III), Co(II), V(V) and Pt(IV) are preferably used. Very good results are achieved in particular with W(VI), Mo(VI), Zn(II), Cu(II), Sn(IV), In(III) and Fe(III). Specific examples of preferred metal compounds are $WO_3$, $MoO_3$, $FeCl_3$, silver acetate, zinc chloride, copper(II) chloride, indium(III) oxide and tin(IV) acetate.

The quantitative ratio between the metal compound and the titanium or zinc compound also depends on the metal used and its oxidation state. In general, e.g. quantitative ratios are used such that a molar ratio of metal of the metal compound to titanium/zinc of the titanium or zinc compound (Me/Ti (Zn)) of from 0.0005:1 to 0.2:1, preferably 0.001:1 to 0.1:1 and more preferably 0.005:1 to 0.1:1 results.

The doping of nanoparticles is described in US 2009/0269510 A1, the contents of which are hereby incorporated into the description. Essentially, an aforementioned metal compound is also added therein during the production.

The nanoparticles used according to the invention can also be surface-modified for example in order to impart to them a compatibility of the composition and also to influence their distribution within an emulsion or their properties for stabilizing an emulsion. Thus, for example, it is possible to influence the contact angle and therefore its property for stabilizing the emulsion.

Thus, the nanoparticles can be surface-modified with hydrophobic, hydrophilic, oleophobic or oleophilic function. To achieve hydrophobic and/or oleophobic properties, e.g. functional groups can be introduced which comprise fluorinated hydrocarbon chains.

Functional groups of this kind can be obtained by reaction of the nanoparticles with a surface modifier. The surface modification of nanoscale particles is a known process, as has been described by the applicant e.g. in WO 93/21127 (DE 4212633) or WO 96/31572. The production of the surface-modified nanoparticles can in principle be carried out in two different ways, namely firstly by surface modification of nanoscale particles already produced and secondly by producing these particles using surface modifiers.

The surface modification of finished nanoparticles can simply take place by mixing the particles with the surface modifier. The reaction takes place optionally in a solvent and, if necessary, through the input of mechanical or thermal energy and/or through catalyst addition.

Suitable surface modifiers are compounds which firstly have one or more groups which are able to react or interact with reactive groups (such as for example OH groups) present on the surface of the nanoparticles. The surface modifiers can form e.g. covalent, coordinating (complexation) and ionic (salt-like) bonds to the surface of the nanoparticles, whereas among the pure interactions, by way of example dipole-dipole interactions, hydrogen bridge bonds and van der Waals interactions are to be mentioned. Preference is given to the formation of covalent bonds, ionic bonds or complexation, very particularly preferably as a result of ionic bonds or complexation.

The surface modifiers generally have a relatively low molecular weight. For example, the molecular weight can be less than 1500, in particular less than 1000 and preferably less than 700 and particularly preferably less than 500, but also a higher molecular weight, e.g. up to 2000 and more, is possible.

For the surface modification of the nanoparticles, inorganic and organic acids, bases, chelating agents, complex formers, such as β-diketones, proteins, which can have complex-forming structures, amino acids or silanes are contemplated. In a preferred embodiment, the surface modifier can be a complexing agent which forms the modification as a result of complexation on the surface of the particles. Specific examples of surface modifiers are saturated or unsaturated mono- and polycarboxylic acids, the corresponding acid anhydrides, acid chlorides, esters and acid amides, amino acids, proteins, imines, nitriles, isonitriles, epoxy compounds, mono- and polyamines, β-dicarbonyl compounds, such as β-diketones, oximes, alcohols, alkyl halides, metal or half-compounds which have a functional group which can react with the surface groups of the particles, e.g. silanes with hydrolyzable groups with at least one nonhydrolyzable group. Special compounds for surface modifiers are specified e.g. in the aforementioned WO 93/21127 and WO 96/31572.

Particularly preferred surface modifiers are saturated or unsaturated carboxylic acids, β-dicarbonyl compounds, amines, phosphonic acids, sulfonic acids or silanes.

As explained, the function group in a preferred embodiment has at least one functional group. For this purpose, use is made of surface modifiers which comprise at least one further functional group besides a functional group for the bonding to the surface of the particles.

Examples of a further functional group for the function group are hydroxy, epoxide, thiol, amino, carboxyl, carboxylic anhydride, sulfonic acid groups, phosphonic acid groups, quaternary amine groups or carbonyl. In the wider sense, fluorinated hydrocarbon groups may also be included. Accordingly, bi-, tri- or higher functional surface modifiers are used for this purpose, with preferably carboxylic acids, β-dicarbonyl compounds, amines, phosphonic acids, sulfonic acids or silanes with at least one additional group selected from the aforementioned functional groups being preferred, such as hydroxycarboxylic acids, amino acids, aminosulfonic acids, aminophosphonic acids, functionalized β-dicarbonylcompounds.

As a result of the surface modification, it is also possible to incorporate groups which favor the deposition of metals. These may be for example reducing groups such as aldehyde groups.

Examples of preferred compounds which are used for the surface modification are listed below:

Examples of carboxylic acids, which preferably contain 1 to 24 carbon atoms, are saturated monocarboxylic acids (e.g. formic acid, acetic acid, propionic acid, butyric acid, pentanoic acid, hexanoic acid, capric acid, stearic acid, phenylacetic acid, benzoic acid), saturated polycarboxylic acids having 2 or more carboxyl groups (e.g. oxalic acid, malonic acid, adipic acid, succinic acid, glutaric acid and phthalic acid), unsaturated carboxylic acids (e.g. acrylic acid, methacrylic acid, crotonic acid, maleic acid, fumaric acid and oleic acid), α-hydroxycarboxylic acids or α-ketocarboxylic acids (e.g. glycolic acid, lactic acid, tartaric acid, citric acid, 2-hydroxybutanoic acid, 2,3-dihydroxypropanoic acid, 2-hydroxypentanoic acid, 2-hydroxyhexanoic acid, 2-hydroxyheptanoic acid, 2-hydroxyoctanoic acid, 2-hydroxydecanoic acid, 2-hydroxydodecanoic acid, 2hydroxytetradecanoic acid, 2-hydroxyhexadecanoic acid, 2-hydroxyoctadecanoic acid, mandelic acid, 4-hydroxymandelic acid, malic acid, erythraric acid, threaric acid, glucaric acid, galactaric acid, mannaric acid, gularic acid, 2-hydroxy-2-methylsuccinic acid, gluconic acid, pyruvic acid, glucuronic acid and galacturonic acid), β-hydroxycarboxylic acids (e.g. salicylic acid, acetylsalicylic acid), and derivatives of the carboxylic acids, such as anhydrides, esters (preferably $C_1$-$C_4$-alkyl esters, e.g. methyl methacrylate) and amides.

Examples of β-dicarbonylcompounds, which preferably contain 4 to 12, more preferably 5 to 8 carbon atoms, are acetylacetone, 2,4-hexanedione, 3,5-heptanedione, acetoacetic acid and acetoacetic acid $C_1$-$C_4$-alkyl esters; and functionalized dicarbonyl compounds, such as hexafluoroacetylacetone and acetoacetamide.

Further examples are mono- and polyamines, in particular those of the general formula $R_{3-n}NH_n$, in which n=0, 1 or 2 and the radicals R, independently of one another, are alkyl groups having 1 to 12, in particular 1 to 8 and particularly preferably 1 to 6 carbon atoms (e.g. methyl, ethyl, n- and isopropyl, butyl or hexyl) and ethylenepolyamines (e.g. ethylenediamine, diethylenetriamine etc.); sulfonic acids, such as 2-aminoethanesulfonic acid and 3-aminobenzenesulfonic acid, phosphonic acids, amino acids; imines; and silanes, such as e.g. the hydrolyzable silanes with at least one nonhydrolyzable group), where those with a functional group on the nonhydrolyzable radical are preferred.

Examples of further suitable surface modifiers are quaternary ammonium salts of the formula $NR^1R^2R^3R^4+ X^-$, in which $R^1$ to $R^4$ are optionally different from one another and are aliphatic, aromatic or cycloaliphatic groups having preferably 1 to 12, in particular 1 to 8, carbon atoms, such as e.g. alkyl groups having 1 to 12, in particular 1 to 8 and particularly preferably to 6, carbon atoms (e.g. methyl, ethyl, n- and isopropyl, butyl or hexyl), and X— is an inorganic or organic anion, e.g. acetate, OH—, Cl—, Br— or I—.

The carbon chains of these compounds can be interrupted by O, S, or NH groups. Such surface modifiers are e.g. oxaalkanoic acids, where 1, 2, 3 or more oxa groups can be comprised. Examples are trioxadecanoic acid, 3-oxabutanoic acid, 2,6-dioxaheptanoic acid and their homologs.

For the $TiO_2$ particles particularly preferred in the context of the invention, a surface modification with an α-hydroxycarboxylic acid, α-ketocarboxylic acid or β-hydroxycarboxylic acid or a derivative thereof is preferred, very particular preference being given to a surface modification with salicylic acid or acetylsalicylic acid.

Preferably, the surface modification of the particles is used in order to stabilize an emulsion. As a result of the surface modification, it is possible to adjust the contact angle of the particles to the particular phases of the emulsion. As a result, the particles can be optimized for a certain emulsion.

This also determines the number of bonded molecules to the surface modification. In a further embodiment, the titanium dioxide particles are surface-modified with less than 10 molecules/$nm^2$, preferably with less than 5 molecules/$nm^2$ (measured using simultaneous thermoanalysis, preferably measured using Netzsch STA 449 C Jupiter).

In one embodiment of the invention, the initiator composition is a dispersion of nanoparticles, which may also be surface-modified, in at least one solvent. The fraction of the nanoparticles here is less than 20% by weight, preferably less than 10% by weight, particularly preferably less than 5% by weight. A preferred range is between 0.5% by weight and 3% by weight. Examples are 1%, 1.5% by weight, 2% by weight and 2.5% by weight. In this connection, the fraction relates to the total initiator composition.

In a preferred embodiment of the invention, the initiator composition is an emulsion. Preferably, it is an emulsion with a content between 15% by weight and 40% by weight of oil phase, preferably a content between 20% by weight and 30% by weight.

In a preferred embodiment of the invention, the initiator composition comprises a Pickering emulsion, i.e. an emulsion which is stabilized by nanoparticles. Preferably here, the nanoparticles are the active substance of the initiator composition. The content of nanoparticles here is more than 0.1% by weight, based on the total initiator composition.

In a preferred embodiment, the Pickering emulsion is prepared in two or more steps. Firstly, an aqueous dispersion of nanoparticles is mixed with a water-immiscible solvent and then dispersed to give an emulsion. Preferably, the content of nanoparticles here is more than 0.1% by weight, preferably more than 0.2% by weight, based on the total emulsion. Preferably, the content of nanoparticles is between 0.1% by weight and 5% by weight, particularly preferably between 0.1% by weight and 2% by weight, very particularly preferably between 0.2% by weight and 1.5% by weight, or 1% by weight. Since the conductive metal layer is only applied in a further step, it is possible to work with considerably lower contents of particles than if metallic particles are used directly.

Particularly in the case of surface-modified particles, creaming of the emulsion can result after a standing time. Here, an upper concentrated emulsion phase is formed as a result of the creaming. If such creaming is observed, the lower, essentially aqueous phase is separated and the upper concentrated emulsion phase is used as initiator composition. In this concentrated emulsion phase, the content of particles may be higher. In this case, the above data refer to the total composition before creaming. The standing time until creaming of the emulsion is preferably 1 to 30 minutes.

It may additionally be necessary to firstly leave the prepared emulsions to stand for a certain time, for example between 1 h and 72 h.

By virtue of the ratio of the two phases and the surface modification of the particles it is possible to adjust the size of the droplets present in the emulsion, in the case of an O/W emulsion the oil droplets. Since these determine the subsequent density of the network, they constitute an important parameter if transparent structures are to be obtained.

In a preferred embodiment of the invention, the average droplet size of the emulsion following application to the substrate is between 1 μm and 500 μm (determined by optical microscopy). In the case of transparent structures, the average droplet size is preferably between 30 μm and 400 μm. Only spherical droplets are taken into consideration here.

The droplet size in solution can change with the age of the emulsion. Depending on the interfacial tension, the result in emulsions is coalescence, which leads to larger droplets.

To apply the initiator composition, customary methods can be used, for example immersion, rolling, knife application, flooding, drawing, spraying, spinning or coating. Application may be complete or partial.

The applied dispersion is dried. The temperature used for this depends on the substrate. For plastic substrates or plastic surfaces, it is naturally not possible to use very high temperatures. Preferably, the drying is carried out at less than 200° C., preferably at less than 150° C. Particularly preferably at less than 100° C. The treatment with the temperature used for the drying preferably takes place for between 2 minutes and 120 hours.

It is important for the method according to the invention that during drying no sintering must take place since the metallic layer is only applied in the next step. It is therefore possible to dry structures also at temperatures of less than 40° C., or less than 30° C. At these temperatures, a drying time of from 1 hour to 36 hours is preferred.

The drying can be performed with or without a cover. The cover can be a glass or plastic plate, a film or a porous filter cloth. A cover can influence the self-organization of the emulsion on the surface.

As already mentioned above, the drying can also have an effect on the size distribution of the disperse phase of the emulsion.

Particularly when using Pickering emulsions with surface-modified particles, the time for drying can be reduced to less than 2 hours, preferably less than 1 hour, preferably at temperatures between 20° C. and 120° C. It is even possible to reduce the drying to less than 10 minutes, preferably less than 6 minutes, particularly preferably less than 4 minutes, preferably at temperatures between 50° C. and 120° C. Such emulsions form a stable grid-like structure on the surface even upon very brief drying. Consequently, the coating of substrates is possible which are only allowed to be exposed to such temperatures for a short period.

It may be necessary to wash the samples and redry them prior to application of the next composition.

In a next step, a precursor composition comprising at least one precursor compound for a metal layer is applied to the substrate.

The precursor composition is usually a solution or suspension of the at least one precursor compound. This solution can also comprise a mixture of two or more precursor compounds. Further auxiliaries, such as reducing agents or wetting auxiliaries, may also be present in the solution.

The precursor compound is preferably a metal complex. This comprises at least one metal ion or a metal atom and at least one type of ligand. The metal is, for example, silver or gold. In a preferred embodiment, the precursor compound is a silver or gold complex, particularly preferably a silver complex. The precursor compound can also comprise several types of metal or mixtures of metal complexes.

Chelate ligands are generally used as ligand. These are able to form particularly stable complexes. They are compounds which have a plurality of hydroxyl groups and/or amino groups. Preference is given to compounds with a molecular weight of less than 200 g/mol, particularly preferably compounds with at least one hydroxyl group and at least one amino group. Examples of possible compounds are 3-amino-1,2-propanediol, 2-amino-1-butanol, tris(hydroxymethyl)aminomethane (TRIS), $NH_3$, nicotinamide or 6-aminohexanoic acid. It is also possible to use mixtures of these ligands. In the case of the preferred silver complex, TRIS is preferred as ligand.

The precursor composition can additionally also comprise further auxiliaries, such as surfactants or assistant reducing agents.

The precursor composition can be applied to the substrate in any desired manner. For this, the precursor composition is applied such that the reduction of the metal ion to the metal can be triggered directly or indirectly by the active substance of the initiator layer. Usually, this happens by virtue of the fact that the precursor composition is applied directly to the initiator layer.

To apply the precursor composition, customary methods can be used, for example immersion, rolling, knife coating, flooding, drawing, spraying, spinning or coating. Application may be complete or partial.

In a further embodiment of the invention, the precursor composition is an emulsion. As a result, the metal compound can be applied to the substrate in a certain structure.

Particular preference is given to emulsions with a content between 15% by weight and 48% by weight of oil phase, based on the total composition, preferably between 30% by weight and 45% by weight in the case of an O/W emulsion and between 60% by weight and 80% by weight in the case of a W/O emulsion. The emulsion can also comprise further dispersants or emulsifiers.

In a next step, the metal ion of the precursor compound is reduced to the metal by the initiator compound. The type of reduction activation depends on the initiator compound used. It may be a thermal, chemical or photochemical activation.

On account of the patterning of at least one of the applied compositions, metal is only deposited in the areas in which precursor compound and the active substance of the initiator composition are arranged one above the other on the surface.

If the initiator composition has been applied as an emulsion, then metal is only deposited where the phase with the active substance of the emulsion was located. In the case of the preferred Pickering emulsions of the active substance, metal is deposited only around the droplets stabilized by the nanoparticles.

Preference is given to a photochemical activation. The action of electromagnetic radiation on the initiator brings about reduction to the metal. A metallic layer is formed in the process. The electromagnetic radiation is radiation of the wavelength for activating the initiator. Here, the irradiation can be achieved by using a flat beam source, such as a lamp, or by means of a laser. Preference is given to using a wavelength in the visible or ultraviolet range of the electromagnetic spectrum, preferably radiation with a wavelength of <500 nm, for example between 200 nm and 450 nm or between 210 nm and 410 nm. It is preferably radiation with a wavelength of <400 nm.

The light source used can be any suitable light source. Examples of a light source are mercury vapor lamps or xenon lamps.

The light source is arranged at a suitable distance from the substrate to be exposed to light. The distance here can for example be between 2.5 cm and 50 cm. The intensity of the radiation here can be between 1 $mW/cm^2$ and 400 $mW/cm^2$ in a spectral range from 250 nm to 410 nm.

The irradiation should take place in as perpendicular a manner as possible relative to the surface to be exposed to light.

The irradiation is carried out over the time sufficing to form the metallic layer. The time depends here on the coating, the type of initiator, the type of lamp, the wavelength range used and the intensity of the irradiation. If conductive structures are to be produced, a longer irradiation may be necessary. Preference is given to an irradiation time between 5 seconds and 10 minutes, preferably between 20 seconds and 4 minutes.

If a laser is used for the irradiation, an argon ion laser (351 nm) with 10 mW can be used, for example, the laser beam of which is focused and collimated and passed at a speed of 2 mm/s over the substrate to be irradiated.

In a further embodiment of the invention, the substrate is treated further following the irradiation and reduction of the precursor compound. Thus, for example, the non-reduced excess precursor composition can be removed by rinsing the surface, for example with deionized water or another suitable substance. The coated substrate can then be dried, for example by heating in an oven, compressed air and/or by drying at room temperature.

It is also possible to apply yet further layers, for example to protect the coated surface from oxidation and water or from UV radiation.

In one embodiment of the invention, a patterning additionally takes place upon application of the precursor composition and/or during the reduction. In the context of the invention, this is understood as meaning a build-up of the spatially limited generation of the metallic structure. This is possible in different ways. Firstly, the substrate can be coated only in certain areas with the initiator composition. Moreover, it is possible to apply the precursor composition only to certain areas. Furthermore, the effect of the electromagnetic radiation can of course also be limited to certain areas. These methods can naturally also be used in combination.

In a preferred embodiment of the invention, the pretreatment comprises a plasma treatment, corona treatment, flame treatment and/or the application and curing of an organic-inorganic coating. A plasma treatment, corona treatment and/or flame treatment is contemplated particularly for film substrates, in particular for plastic films. In this connection, it has been found that such a treatment improves the quality of the resulting photocatalytic layer.

Possible ways of obtaining plasma under vacuum conditions have often been described in the literature. The electrical energy can be linked by inductive or capacitive means. It can be direct current or alternating current; the frequency of the alternating current can range from a few kHz into the MHz range. An input of energy in the microwave range (GHz) is also possible.

Primary plasma gases that can be used are, for example, He, argon, xenon, $N_2$, $O_2$, $H_2$, steam or air, and likewise mixtures of these compounds. Preference is given to an oxygen plasma.

The substrates are usually cleaned beforehand. This can take place by means of simple rinsing with a solvent. The substrates are then optionally dried and then treated with plasma for less than 5 minutes. The treatment time can depend on the sensitivity of the substrate. It is usually between 1 and 4 minutes.

A further option to improve the quality of the photocatalytic layer is the prior flame treatment of the surface. Such a treatment is known to the person skilled in the art. The parameters to be selected are pregiven by the specific substrate to be treated. For example, the flame temperatures, the flame intensity, the residence times, the distance between substrate and flame, the nature of the combustion gas, air pressure, humidity, are matched to the substrate in question. The flame gases used can be, for example, methane, propane, butane or a mixture of 70% butane and 30% propane. This treatment is also used preferably in the case of films, particularly preferably for plastic films.

It may be necessary to sinter the resulting metallic structures by means of an additional heat treatment. However, preference is given to carrying out no additional heat treatment.

In a preferred embodiment of the invention, the method comprises no heat treatment at above 100° C. Using the method according to the invention, it is even possible to work only at temperatures of less than 50° C., or less than 40° C.

The advantage of the method according to the invention is in particular that, as a result of the subsequent deposition of the metal, the amount of deposited metal and therefore the conductivity of the structures can be controlled considerably better. If metallic particles are used directly, it is necessary to work with a high content of particles. At the same time, a sintering of the structures is required in order to fuse the particles with one another. This can be prevented using the method according to the invention.

Moreover, particularly if the initiator composition is applied as emulsion, in particular as Pickering emulsion with nanoparticles as active substance, it is possible to work with a smaller content of nanoparticles.

In the method according to the invention, no further compositions are applied to the substrate especially between the application of the initiator composition and the application of the precursor composition and the subsequent metallization. On account of the selective deposition, no sealing of the areas of the substrate not coated with the active substance prior to applying the precursor composition is necessary either.

A further subject matter is a Pickering emulsion as described above for the initiator composition, comprising an aqueous phase and at least one phase immiscible with the aqueous phase, and titanium dioxide nanoparticles. This emulsion can preferably be used for producing photocatalytically active structures on surfaces, in particular for the deposition of metals.

The invention further provides electrically conductive coatings obtained by a method according to the present invention.

Particular preference is given to transparent conductive coatings.

The transparent and conductive coatings according to the invention can be used for example as transparent electrodes for displays, screens and touch panels.

Further details and features arise from the following description of preferred working examples in conjunction with the dependent claims. Here, the respective features can be realized on their own or in multiples in combination with one another. The possibilities of solving the problem are not limited to the working examples. Thus, for example, range data always include all—unspecified—interim intermediate values and all conceivable subintervals. The working examples are shown diagrammatically in the figures. The same reference numerals in the individual figures refer to elements that are identical or functionally identical or correspond to one another in terms of their functions. Specifically:

DETAILED DESCRIPTION OF THE INVENTION

Figure 1:
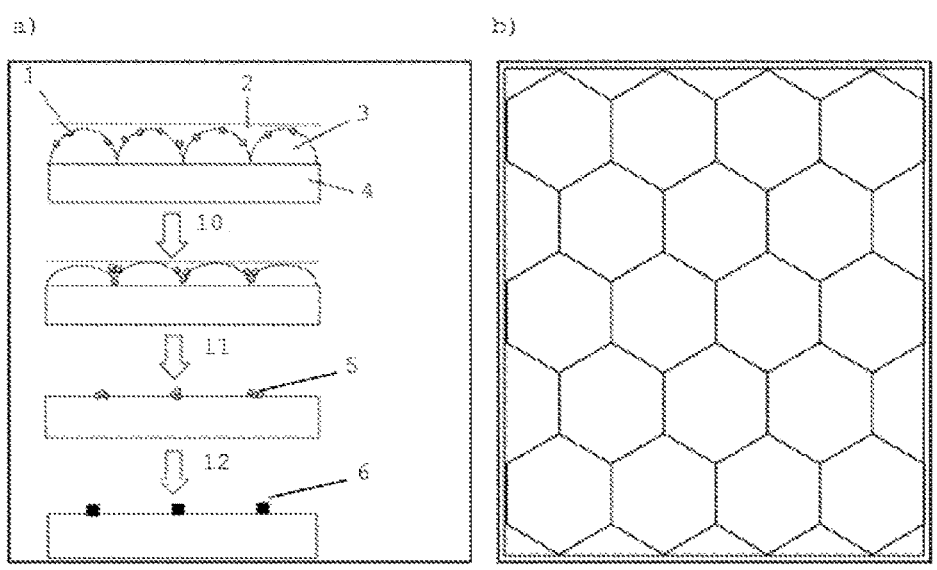
FIG. 1 shows a) diagrammatic representation of the method according to the invention; b) diagrammatic representation of the resulting network.

FIG. 1a shows a diagrammatic representation of a preferred embodiment of the method. Firstly, an emulsion of an initiator composition comprising two phases 2, 3, which comprises nanoparticles 1, is applied to a substrate 4. It is preferably a Pickering emulsion which is stabilized by the nanoparticles 1. The applied emulsion is dried on the surface of the substrate (step 10). This results in the concentration of the nanoparticles at the phase interfaces of the emulsion on the surface (step 11). This gives rise to the formation of thin grid-like structures of the nanoparticles 5. Then (step 12), a metal 6 is deposited on the nanoparticles. This gives a grid-like metalized structure. An idealized representation of the resulting structure is shown in FIG. 1b.

Figure 2:
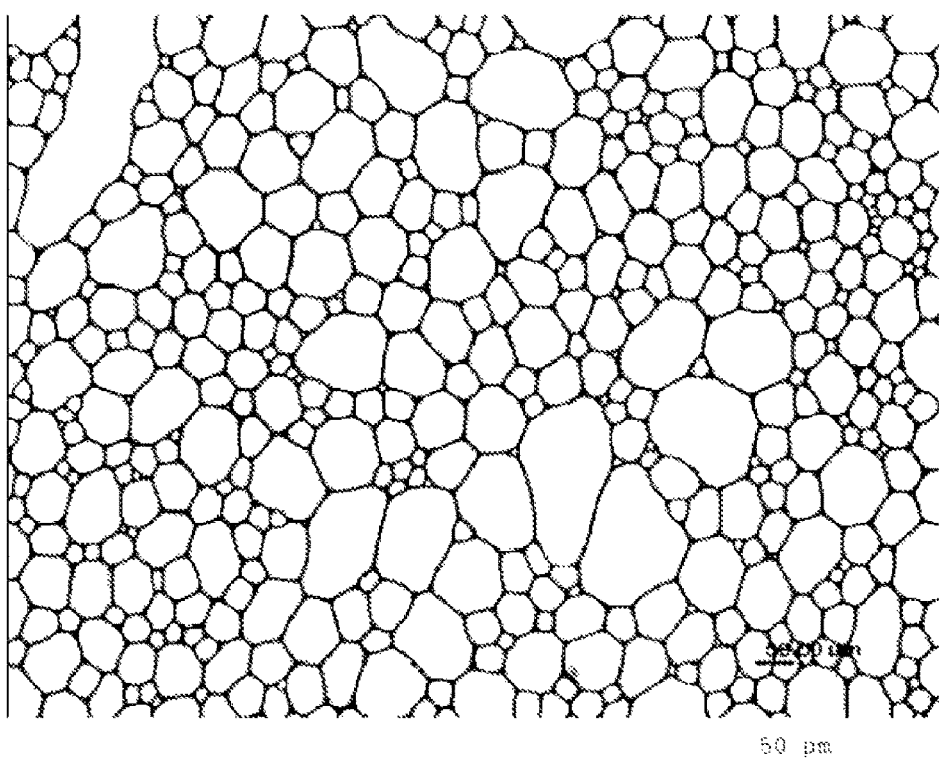
FIG. 2 shows a photomicrograph of emulsion 7 h on a substrate under a cover glass (20° C.)
Figure 3:
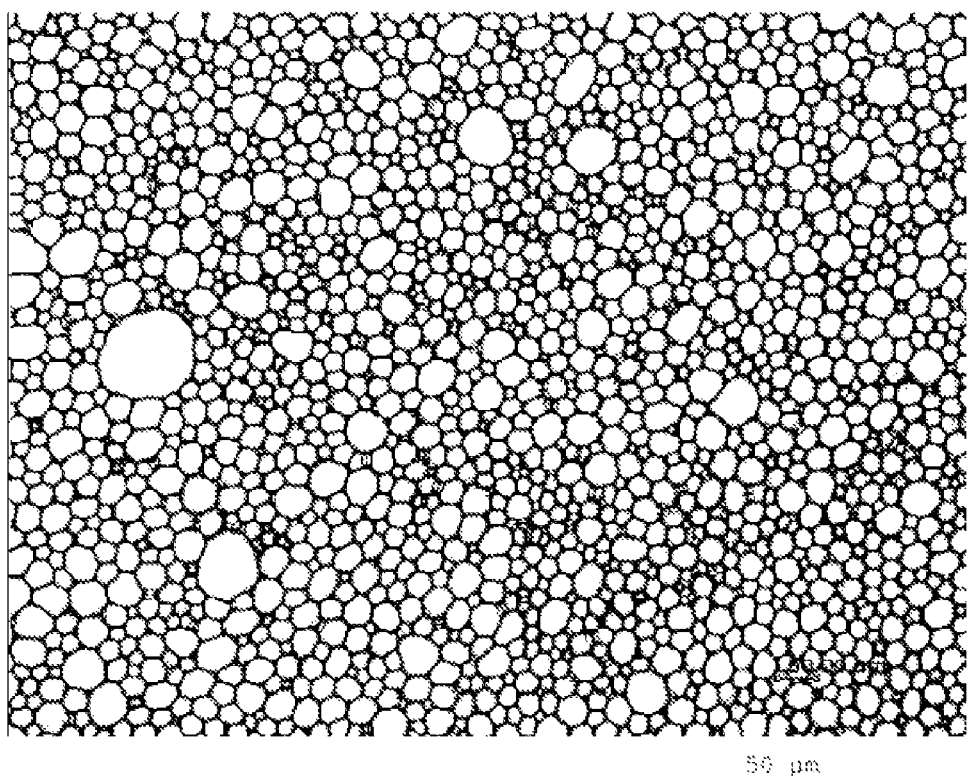
FIG. 3 shows a photomicrograph of emulsion 7 k on a substrate under a cover glass (20° C.)

FIG. 2 shows a photomicrograph of an emulsion with unmodified titanium dioxide particles. The emulsion exhibits a droplet size between 30 and 140 µm on the substrate. FIG. 3 shows the influence of the addition of butanol as weak emulsifier. It leads to a considerable reduction in droplet size.

Figure 4:
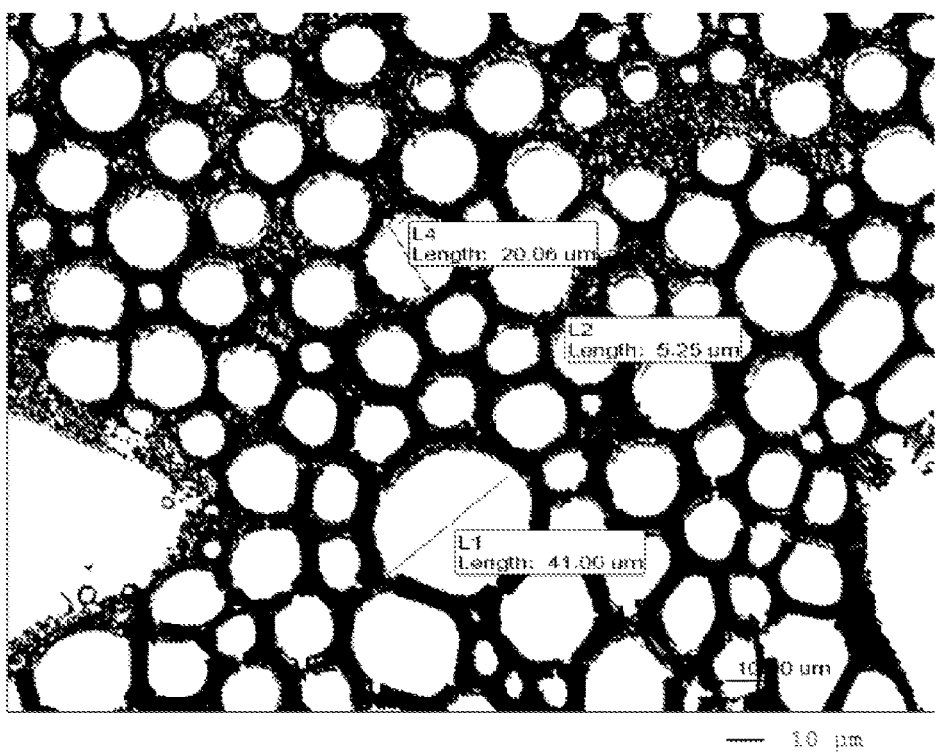
FIG. 4 shows a photomicrograph of a titanium dioxide nanoparticle emulsion (sample 7 h) before metallization. The scale is 10 μm.
Figure 5:
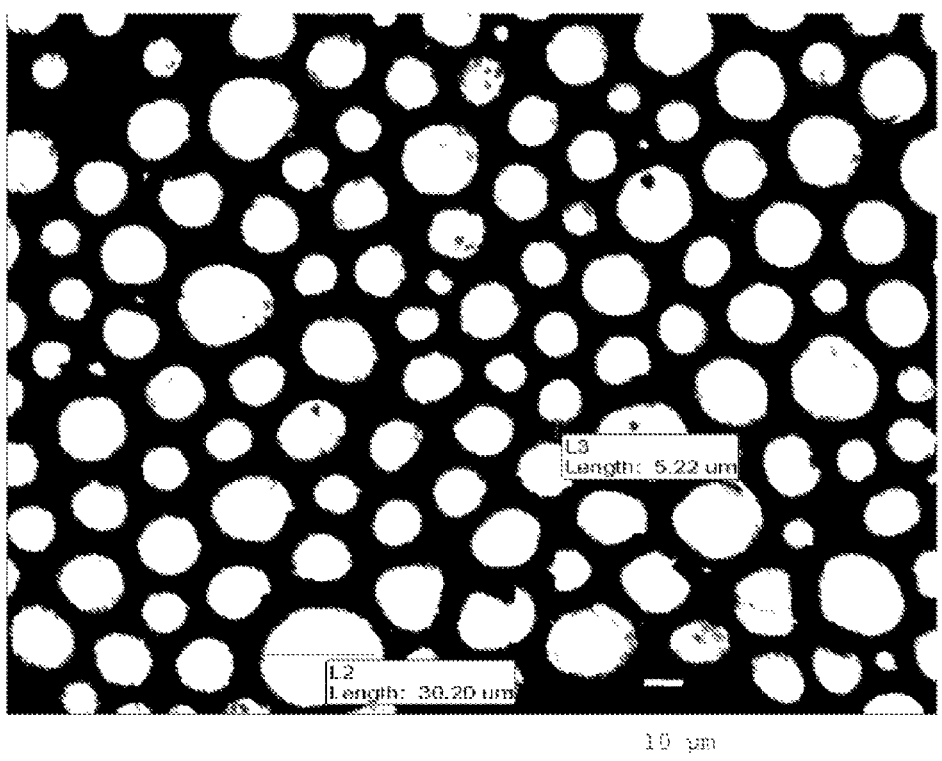
FIG. 5 shows a photomicrograph of a titanium dioxide nanoparticle emulsion (sample 7 h) after metallization. The scale is 10 μm.

FIG. 4 shows an emulsion with unmodified titanium dioxide particles after drying which, in FIG. 5, has been metalized in the next step with silver. The images show that the metal deposition takes place very selectively only on the titanium dioxide. However, the size of the droplets is relatively small, meaning that the sample does not appear transparent after the metallization.

Figure 6:
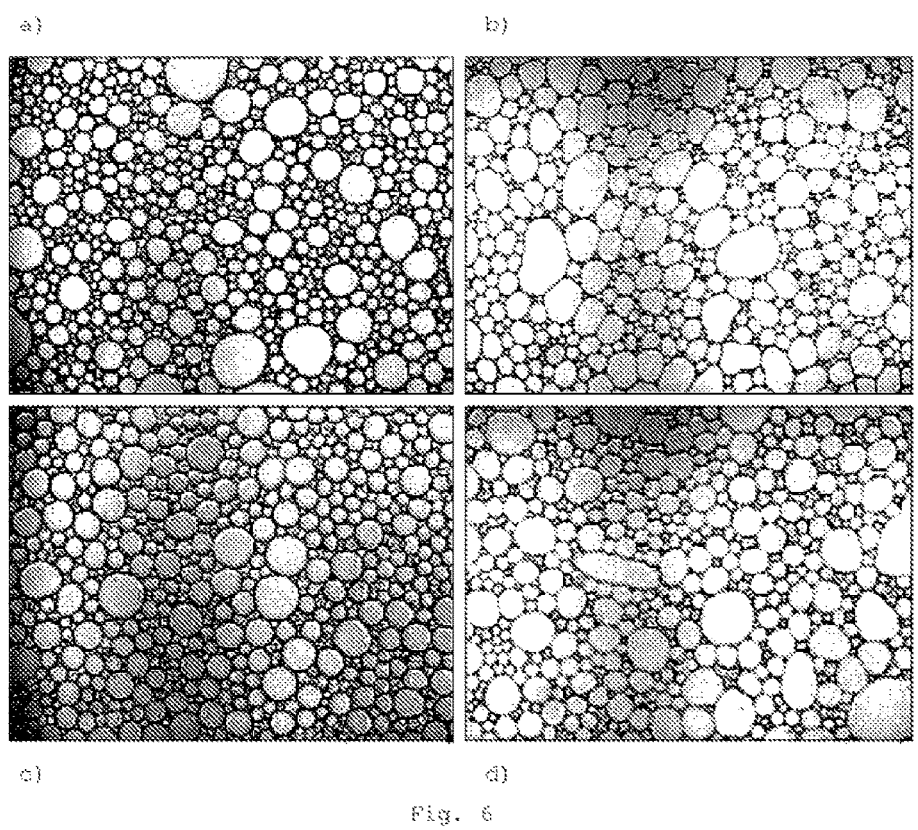
FIG. 6 shows photomicrographs of emulsions; a) emulsion 8a directly after application; b) the same emulsion 15 minutes later; c) emulsion 8g after application; d) the same emulsion 15 minutes later.

FIG. 6 shows the aging of emulsions at room temperature of two emulsions with surface-modified particles. It can be seen clearly that larger droplets are formed from the surface. A monolayer of relatively large drops is formed here. After 10 minutes, dynamics are no longer to be observed and the solvents slowly evaporate.

Figure 7:
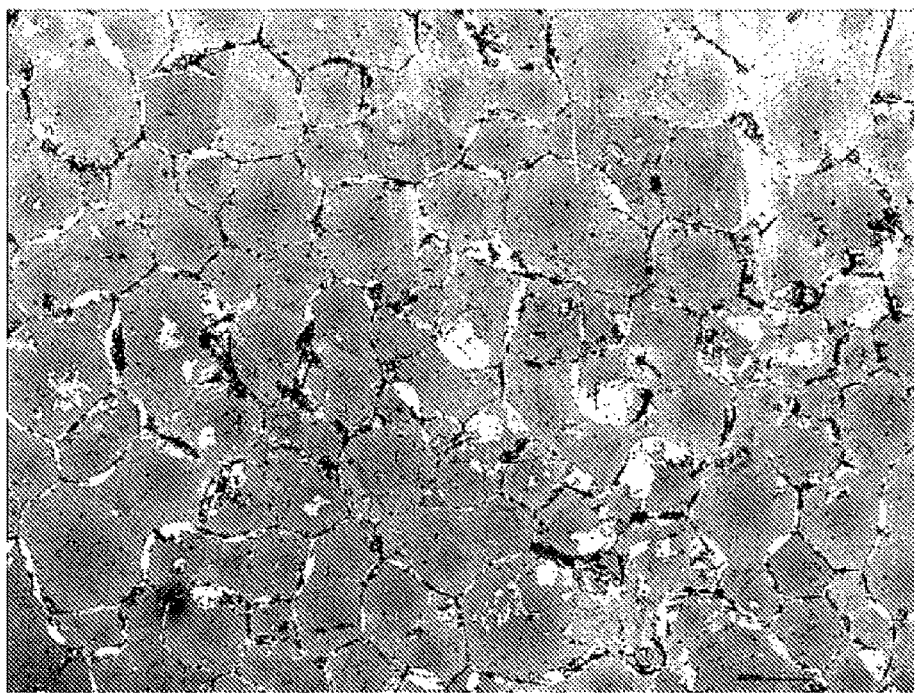
FIG. 7 shows a photomicrograph of the dried emulsion (8a) at 90° C. with incident light; grey areas are uncoated.
Figure 8:
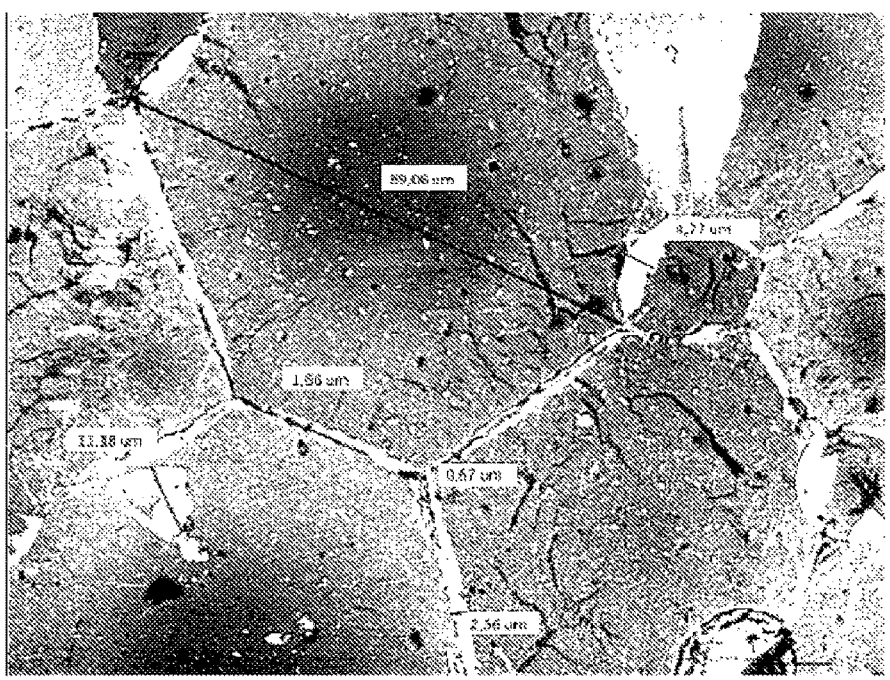
FIG. 8 shows a section from FIG. 7.

FIGS. 7 and 8 show a dried emulsion with surface-modified titanium dioxide particles. It is possible to clearly see the formed webs of titanium dioxide which form a honeycomb-like pattern.

Figure 9:
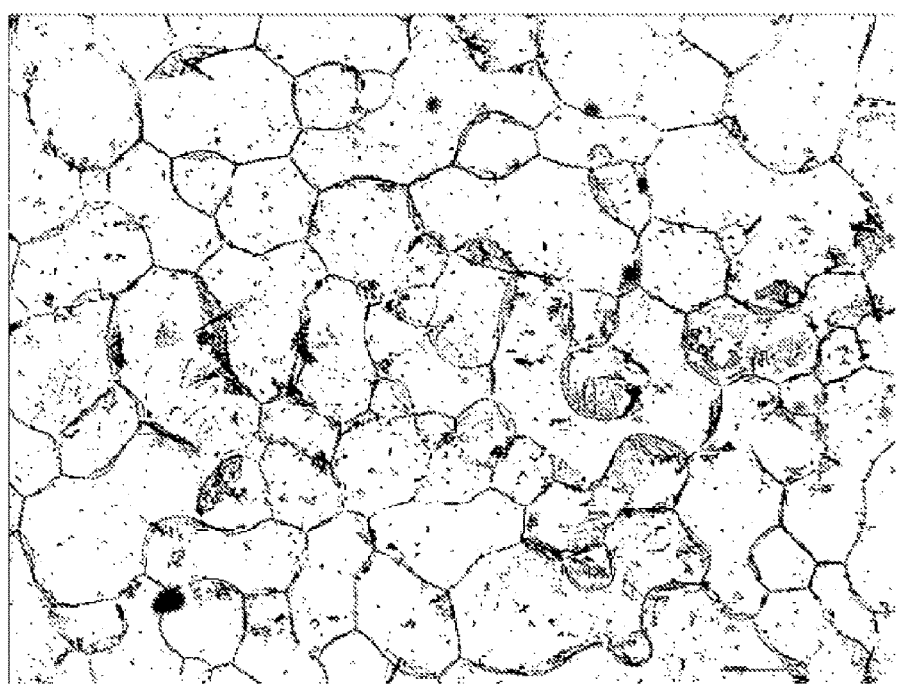
FIG. 9 shows a photomicrograph of the silver-coated emulsion (8a) with incident light.

As shown in FIG. 9, this structure can be metalized with silver in a simple manner.

WORKING EXAMPLES

For transmission electron microscopy (TEM), a Philips CM200 FEG (200 kV accelerating voltage) was used.

The photomicrographs were recorded using an Olympus BH2 Series System Microscope with transmitted light or incident light.

Dynamic light scattering (DLS) for measuring the hydrodynamic radius was carried out using a Microtrac Nanotrac Ultra.

1. Synthesis of TiO$_2$ Nanoparticles (Anatase)

97.07 g (342 mmol) of titanium isopropoxide in 105.45 g (1745 mmol) of 1-propanol are charged to a 250 ml round-bottomed flask and intensively stirred. 6.69 g (68 mmol) of 37% strength hydrochloric acid are added to 20.00 g (333 mmol) of 1-propanol and this solution is slowly added dropwise to the reaction mixture after 2 minutes. After 30 minutes, a mixture of 8.05 g (447 mmol) of water and 40.00 g (666 mmol) of 1-propanol is added dropwise.

Figure 10:
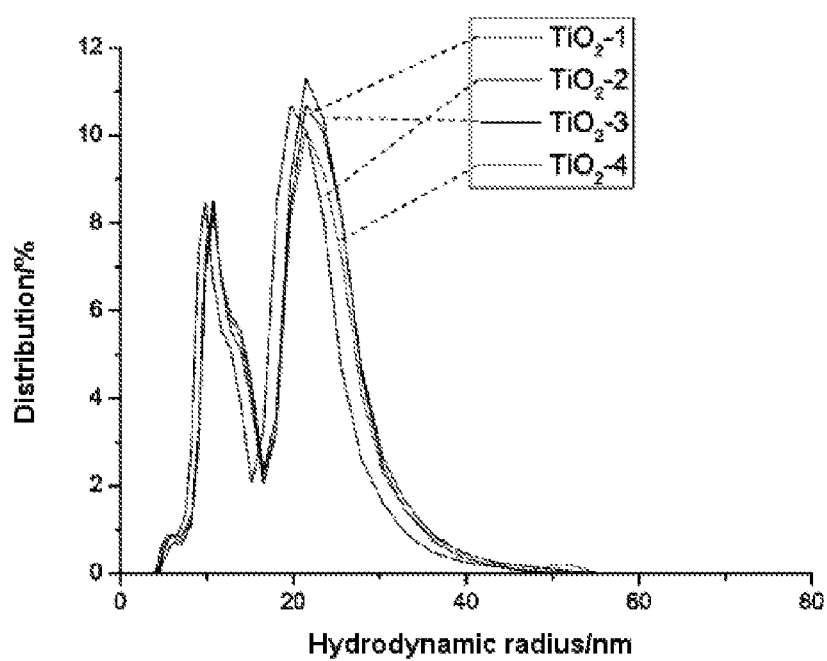
FIG. 10 shows DLS measurements of a dispersion with 2% by weight $TiO_2$ at 20° C.

The mixture is stirred for a further 20 minutes and the sol produced in this way is placed in equal parts into two Teflon containers and brought to 225° C. in the autoclave over the course of 30 minutes and held at this temperature for 120 minutes. After cooling, the solvent is decanted off and discarded, the sediment is dried almost completely on a rotary evaporator at a maximum of 40° C. The anatase nanoparticles are obtained as white powder. FIG. 10 shows the size distribution measured with DLS.

Characterization: BET: 11.14 nm; DLS: 1st maximum: 10.52 nm (S=0.31), 2nd maximum: 21.04 nm (S=0.77); Raman: $E_G$: 146 cm$^{-1}$, $B_{1G}$: 399 cm$^{-1}$, $A_{1G}$: 639 cm$^-$, $E_G$: 639 cm$^{-1}$.

2. Surface Modification with Acetylsalicylic Acid (ASA)

0.18 g of acetylsalicylic acid (1 mmol) is suspended in 45 g of water and the resulting suspension is filtered in order to separate off excess acetylsalicylic acid from the saturated solution.

With vigorous stirring, a dispersion of 10 g of water with 2.50 g (31 mmol) of titanium dioxide particles (anatase) is added dropwise very slowly. The mixture is mixed intensively for a further 10 minutes. By adding 7.03 g (71 mmol) of 37% strength hydrochloric acid, acetic acid is eliminated from acetylsalicylic acid and the reaction mixture becomes intense yellow in color. The resulting particles are centrifuged, and the supernatant is decanted off and discarded. The residue is redispersed in 40.00 g of water. This gives a clear, yellow dispersion.

Figure 11:
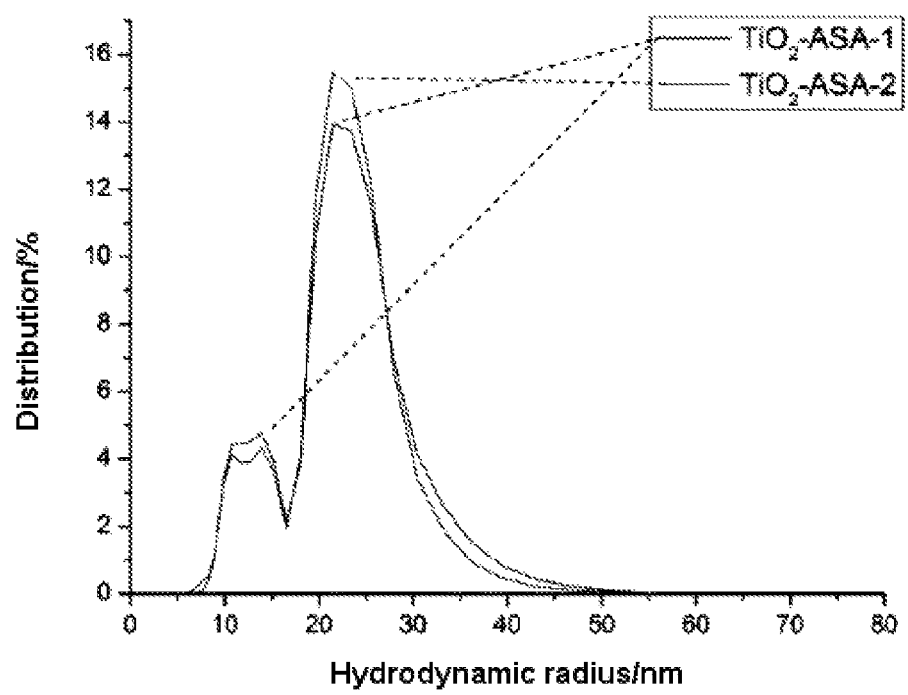
FIG. 11 shows DLS measurements of a diluted solution of $TiO_2$ particles modified with acetylsalicylic acid at 20° C.

FIG. 11 shows DLS measurements of several samples which have been produced by the same method. The diluted dispersion obtained was measured.

3. Surface Modification with Salicylic Acid (SA)

0.14 g (1 mmol) of salicylic acid is suspended in 40 g of water and the excess salicylic acid is separated off by filtration. With vigorous stirring, a dispersion of 20 g of water and 3.58 g (44 mmol) of titanium dioxide is slowly added dropwise. The mixture is stirred intensively for a further 30 minutes. A slightly cloudy, yellow dispersion is obtained.

Figure 12:
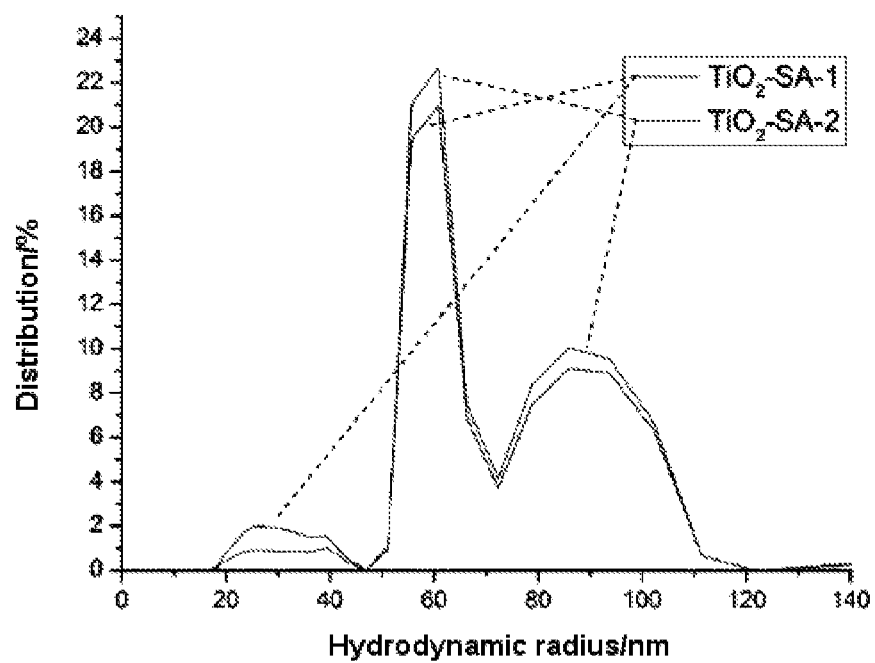
FIG. 12 shows DLS measurement of a dilute solution of $TiO_2$ particles modified with salicylic acid at 20° C.

FIG. 12 shows DLS measurements of several samples which have been produced by the same method. The diluted dispersion obtained was measured.

4. Producing Titanium Dioxide Pickering Emulsions

In accordance with table E1, various emulsions are synthesized in a 250 ml flask which differ in the ratios of toluene, water, butanol and titanium dioxide nanoparticles. In principle, water and titanium dioxide nanoparticles are introduced and then homogenized using an IKA® T25 Ultra Turrax® at 25 000 rpm for two minutes. Then, the organic solvents are added and the mixture is homogenized with cooling for a further three minutes at 25 000 rpm.

TABLE E1

Toluene/water emulsions with TiO$_2$ nanoparticles (unmodified)

| Emulsion | Water [g] | Toluene [g] | Butanol [g] | TiO$_2$ [g] |
|---|---|---|---|---|
| 7a | 100.04 | 87.03 | — | 1.0 |
| 7b | 100.03 | 86.79 | — | 1.5 |
| 7c | 99.97 | 86.80 | — | 2.0 |
| 7d | 75.04 | 130.15 | — | 1.0 |
| 7e | 74.89 | 130.24 | — | 1.5 |
| 7f | 75.01 | 130.12 | — | 2.0 |
| 7g | 150.03 | 52.02 | — | 1.0 |
| 7h | 150.07 | 52.06 | — | 1.5 |
| 7i | 150.12 | 52.07 | — | 2.0 |
| 7j | 150.10 | 51.96 | 5 | 1.5 |
| 7k | 149.97 | 51.97 | 10 | 1.5 |
| 7l | 150.03 | 52.04 | 15 | 1.5 |

The emulsions with butanol as weak emulsifier exhibit a considerably reduced droplet size. On account of the free OH groups on the surface of the titanium dioxide particles used, these stabilize preferably O/W emulsions. As expected, the W/O emulsions 7d, 7e, 7f are not stabilized by these titanium dioxide particles. In all other cases, emulsions are formed.

5. Producing Titanium Dioxide Pickering Emulsions with Surface-modified Particles In accordance with table E2 and E3, various emulsions are synthesized in a 20 ml glass vessel. 0.06 g (1 mmol) of sodium chloride and 10.00 g of water are used to prepare an NaCl solution.

The dispersions from example 2 (TiO$_2$ with ASA) or example 3 (TiO$_2$ with SA) are initially introduced, and the NaCl solution is added. After adding the organic phase, hydrochloric acid (37%) is added and the mixture is emulsified using a vibration mixer (Heidolph® Reax Control®)

at 25 000 rpm. In the first minutes, creaming may result, depending on the solvent. In this case, the upper phase after the creaming is used as emulsion and referred to as emulsion. Tables E2 and E3 show the prepared emulsions.

TABLE E2

Emulsions based on toluene

| Name | TiO$_2$ with ASA [g] | TiO$_2$ with SA [g] | Toluene [g] | Water [g] | HCl [g] | NaCl solution [g] |
|---|---|---|---|---|---|---|
| 8a | 1.03 | — | 4.33 | 10.01 | 1.01 | 0.14 |
| 8b | 2.01 | — | 4.32 | 9.00 | 1.00 | 0.10 |
| 8c | 3.00 | — | 4.33 | 8.03 | 1.00 | 0.13 |
| 8d | — | 1.00 | 4.33 | 10.00 | 1.01 | 0.10 |
| 8e | — | 1.98 | 4.28 | 9.00 | 1.00 | 0.10 |
| 8f | — | 3.01 | 4.28 | 7.98 | 0.99 | 0.12 |

TABLE E3

Emulsions based on cyclohexane

| Name | TiO$_2$ with ASA [g] | TiO$_2$ with SA [g] | Cyclo-hexane [g] | Water [g] | HCl [g] | NaCl solution [g] |
|---|---|---|---|---|---|---|
| 8g | 1.02 | — | 4.67 | 10.00 | 1.00 | 0.12 |
| 8h | 1.98 | — | 4.67 | 9.00 | 1.00 | 0.14 |
| 8i | 3.00 | — | 4.66 | 7.97 | 1.00 | 0.12 |
| 8j | — | 1.00 | 4.67 | 10.00 | 1.01 | 0.13 |
| 8k | — | 1.99 | 4.65 | 9.04 | 1.00 | 0.11 |
| 8l | — | 2.99 | 4.68 | 8.06 | 0.99 | 0.12 |

6. Application of the Initiator Composition without Surface Modification 200 µl of emulsion 7h were placed onto a glass slide. The samples are prepared in three different ways: (1) they are covered with a second slide; (2) they are dried without covering; (3) they are covered with a filter cloth. After drying, the slides were washed thoroughly with distilled water in order to separate off excess titanium dioxide.

FIG. 7 shows sample 7h after drying at 20° C. for 26 hours.

7. Application of the Initiator Composition with Surface Modification:

In each case 200 µl of the prepared emulsions 8a to 8l were placed onto glass slides and dried without covering. Table E4 shows the drying conditions of the emulsions. Then, any excess titanium dioxide and sodium chloride were rinsed off from the slides using distilled water and the samples were dried using compressed air.

TABLE E4

| Temperature [° C.] | Time [min] |
|---|---|
| 30 | 60 |
| 40 | 20 |
| 50 | 7 |
| 60 | 7 |
| 70 | 5 |
| 80 | 5 |
| 90 | 3 |
| 100 | 3 |

In all cases, a self-organization, i.e. the formation of a grid-like structure was observed.

FIGS. 7 and 8 show photomicrographs of the dried structure of emulsion 8a at 90° C. and 3 minutes.

The surface-modified particles are localized at the interface of the two phases of the emulsion on account of their salicylic acid modification. They arrange themselves in the course of drying between the drops and this produces a network. Whereas the width of the titanium oxide ribs varies in the range from 1 µm to 3 µm, large, uncoated ranges from 40 µm to 90 µm diameter are obtained. The smaller droplets present in the images prior to drying have disappeared during drying due to coalescence and aging of the emulsion.

Only the few evident broadenings of the ribs make the coating on the slides partially visible. In areas in which these miscoatings are not present or at least barely present, the dried sample appears optically transparent.

8. Producing a precursor composition (Ag-TRIS)

With vigorous stirring, a solution of 1.69 g (10 mmol) of silver nitrate in 20 g of water was slowly added dropwise to a solution of 2.57 g of tris(hydroxymethyl)aminomethane (9 mmol) in 20 g of water.

9. Application of the Precursor Composition

The dried samples were flooded with Ag-TRIS and then exposed to an Hg-Xe lamp (1000 watts) for 10 to 30 seconds. Silver is deposited only at the titanium dioxide ribs.

FIG. 5 shows an exposed sample (30 seconds; Hg-Xe lamp; 1000 watts) of an emulsion with non-surface-modified titanium dioxide particles. A distribution of round non-silvered areas is evident. Silvered ribs are approx. 6 µm wide. Consequently, although the sample is uniformly selectively metalized, the sample is not transparent.

FIG. 9 shows an exposed sample (15 seconds Hg-Xe lamp; 1000 watts) of an emulsion with surface-modified titanium dioxide particles. This sample too was only silvered in the area coated with titanium dioxide particles. The optical transparency does not change since the ribs are considerably thinner.

CITED LITERATURE

WO 2012/084849 A2
US 2009/0269510 A1
WO 93/21127
DE 4212633
WO 96/31572

The invention claimed is:

1. A method for producing structured metallic coatings, comprising the following steps:
   a) application of an initiator composition comprising at least one active substance to a substrate, wherein the initiator composition comprises a Pickering emulsion;
   b) application of a precursor composition comprising at least one precursor compound for a metal layer to the substrate; and
   c) deposition of a metal layer of the precursor composition by the active substance of the initiator composition;
   wherein at least one of the compositions in step a) and/or step b) comprises an emulsion.

2. The method as claimed in claim 1, the active substance comprises reducing groups or precursors thereof or a photo catalytically active inorganic substance.

3. The method as claimed in claim 1, wherein the active substance comprises ZnO or TiO$_2$.

4. The method as claimed in claim 3, wherein the active substance comprises nanoscale particles of ZnO or TiO$_2$.

5. The method as claimed in claim 4, wherein the particles are surface-modified.

6. The method as claimed in claim 1, wherein a content of nanoparticles in the initiator composition is more than 0.1% by weight.

7. The method as claimed in claim 1, further comprising a drying carried out between step a) and step b).

* * * * *